United States Patent
Handforth et al.

(12)

(10) Patent No.: US 6,441,319 B1
(45) Date of Patent: Aug. 27, 2002

(54) INSERTED COMPONENTS FOR VIA CONNECTION OF SIGNAL TRACKS TO ACHIEVE CONTINUOUS IMPEDANCE MATCHING IN MULTI-LAYER SUBSTRATE

(75) Inventors: Martin R. Handforth; Herman Kwong, both of Kanata; Richard R. Goulette, Arnprior; Rolf G. Meier, Carp, all of (CA)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 09/749,470

(22) Filed: Dec. 28, 2000

(51) Int. Cl.⁷ .................................................. H01R 9/09
(52) U.S. Cl. .................... 174/262; 174/203; 29/830; 29/852; 228/180.22; 427/97
(58) Field of Search .................... 174/262, 263, 174/264; 29/852, 830; 427/97; 361/760; 438/78; 228/180.22

(56) References Cited

U.S. PATENT DOCUMENTS

| | | | | |
|---|---|---|---|---|
| 5,419,038 A | * | 5/1995 | Wang et al. | 29/852 |
| 5,590,029 A | * | 12/1996 | Estes | 361/760 |
| 5,659,953 A | * | 8/1997 | Crane et al. | 29/830 |
| 6,181,219 B1 | * | 1/2001 | Gailus et al. | 174/262 |

\* cited by examiner

*Primary Examiner*—Albert W. Paladini
(74) *Attorney, Agent, or Firm*—Hunton & Williams

(57) ABSTRACT

A technique for connecting signal tracks within a multi-layer substrate is disclosed. In one embodiment, the technique is realized by providing an opening in a substrate and fitting an inserted component into the opening. The inserted component comprises a dielectric block mounted to a lead frame. The lead frame is conductive such that a signal layer formed between the inserted component and the substrate connects signal tracks on multiple signal layers of the substrate.

26 Claims, 12 Drawing Sheets

INSERTED COMPONENTS FOR VIA CONNECTION OF SIGNAL TRACKS TO ACHIEVE CONTINUOUS IMPEDANCE MATCHING IN MULTI-LAYER SUBSTRATE

FIELD OF THE INVENTION

The present invention relates generally to multi-layer substrates and, more particularly, to a technique for facilitating connection of signal tracks and impedance matching in multi-layer substrates.

BACKGROUND OF THE INVENTION

The present state of the art involves the use of vias, which are holes plated with metal, to connect signal tracks on different layers in multi-layer substrates. Such vias, when used with high-speed signals such as digital signals, lead to problems such as impedance mismatches and cross-talk to adjacent signal tracks on any layer and to adjacent vias.

The extent of the problem depends upon the type of via used and related size and material characteristics. There are three basic via classifications, namely:

a) Super-Via—extends all of the way through the substrate;

b) Blind Via—visible from outside of the substrate on one side only (a microvia is a type of blind via which is typically fabricated by laser drilling and is smaller than mechanically fabricated blind vias); and c) Buried Via—not visible from outside of the substrate.

The high frequency performance of vias depends mainly on a number of geometric features such as length of the plated-through hole, and diameter of the plated-through hole. The high frequency performance of vias further depends on the dielectric constant of the substrate dielectric layers. Other features that impact the high frequency performance of vias include the number, size, and shape of metallic pads used on the via and the number, size, and shape of the clearance holes, also called antipads, used where the plated-through hole must penetrate the metal reference planes (eg., ground or power planes). Performance is also impacted by the location and orientation of the electrical connections between the via structure and the signal layers, eg., the angle between connecting layers and the physical separation between connected signal layers and the presence of extraneous via projections beyond the segment of the via that carries the signal between the connected layers. These projections as transmission line stubs which exacerbate the impedance match.

Ideally, the via structure between the connected layers should have a uniform controlled impedance which matches that of the signal tracks that it connects together, and also the via should not project beyond the connected region (no stubs allowed). Conventional vias inherently do not have a uniform controlled impedance, since the proximity of the via cylindrical outer surface to adjacent ground and power reference plane surfaces varies along the length of the via. Also, metal pads which are used to bridge the connection from a signal track to the periphery of the via cylinder and which also typically appear on primary and secondary substrate layers also act as lumped capacitive loads on the via, worsening the uniformity of the via impedance. As a result, the high-speed circuit design of conventional vias only attempts to control the average value of the via impedance over its length, which limits the high frequency/high speed performance of these structures. In many applications, layout and design constraints prevent even this from being attained. For example, in dense wiring areas of the substrate, the clearance holes around the vias (antipads) simply cannot always be increased in diameter sufficiently to increase the impedance to typically desired values of 50 Ohms. The limit is reached when the antipads blend together to create a large slot in the reference planes which is normally unacceptable because signal layers routed over such a slot will experience a serious impedance discontinuity.

Another constraint is that the via diameter reaches a lower limit determined by the maximum aspect ratio (defined as the length to diameter ratio of the drilled via holes) of the PCB fabrication technology which is typically in the range of 7:1 to 10:1 for supervias.

In conventional via structures, stubs can only be avoided by the use of blind or buried vias, or by controlled depth drilling to remove the unused portions of the via. All of these approaches incur a significant cost penalty.

Cross-talk associated with conventional vias can be from via to signal layer or via to via in high density layouts. Problems can occur if a combination of large via size and very high frequency or speed occurs. Such crosstalk problems can mainly be solved by increasing the spacing between affected conductors, as the insertion of a shielding conductor is not normally practicable or effective in high density wiring environments.

In view of the foregoing it would be desirable to provide a technique for connecting signal layers in a multi-layer substrate which overcomes the above-described inadequacies and shortcomings. More particularly, it would be desirable to provide a technique for connecting signal layers and avoiding impedance mismatching in an efficient and cost effective manner.

SUMMARY OF THE INVENTION

According to the present invention, a method for connecting signal tracks on different layers in a multi-layer substrate is provided. The method comprises the steps of forming an opening in the substrate through at least two layers of the substrate and inserting a first component into the opening, the first component comprising a dielectric block and a conductive layer bonded to the dielectric block extending through the substrate so as to connect at least two signal tracks on different layers. The method additionally comprises bonding the first component to the substrate.

In accordance with other aspects of the present invention, a multi-layer substrate is provided that comprises a plurality of signal tracks on different layers and an opening formed through at least two layers of the substrate. A first component is inserted in the opening. The first component comprises a dielectric block, wherein the placement of the first component creates a path intersecting with at least two signal tracks on different layers. A conductive layer is bonded to the dielectric block to create a signal layer connecting the two signal tracks on different layers.

In accordance with further aspects of the present invention, a system for connecting signal tracks on different layers within a substrate is provided. The system comprises a first passive component insertable into a substrate. The first passive component is shaped to contact at least two signal tracks on different layers of the substrate. The system further comprises additional material shaped to be positioned adjacent the first inserted component so as to create an electrical conductor path between the additional material and the first inserted component intersecting with the at least two signal tracks on different layers.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Figure 1:
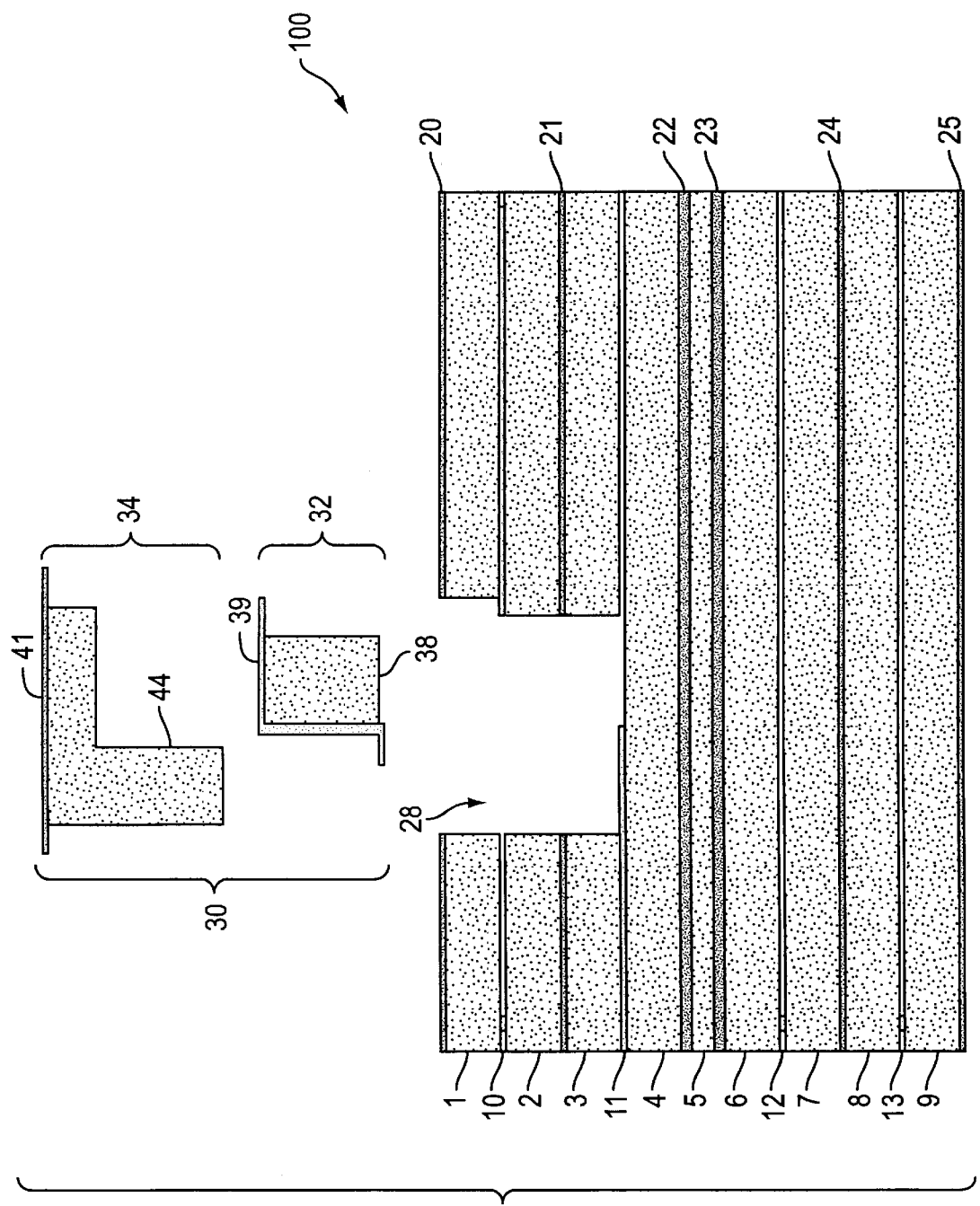
FIG. 1 is a cross-sectional view of the construction of a substrate in accordance with an embodiment of the present invention.

Referring to FIG. 1, a substrate 100 includes a plurality of layers. Layers 1–9 are dielectric layers that may be composed of any known dielectric materials. Interspersed between the dielectric layers 1–9 are signal layers 10, 11, 12, and 13, and metal reference planes including ground layers 21, 22, and 24, power layer 23, primary layer 20, and secondary layer 25. Each signal layer 10–13 includes one or more signal tracks. The primary layer 20 is preferably formed on a dielectric layer 1 and the secondary layer 25 is preferably formed on a dielectric layer 9. The particular structures described above in the reference to FIG. 1 are merely exemplary. The multi-layer substrate may include any desired number of dielectric and reference plane layers. Furthermore, while the term "metal reference planes generally refers to unbroken planes, it is possible to incorporate signal tracks and a metal reference plane on the same layer.

An opening 28 is formed through the top three dielectric layers 1–3 of the substrate. The opening 28 is preferably created through the use of laser drilling or machining.

The inserted components 30 shown in FIG. 1 comprise a first inserted component 32 and a second inserted component 34. The first inserted component 32 comprises a dielectric block 38 and a conductive layer 39 such as a lead frame. The second inserted component 34 comprises a dielectric block 44 and a ground plane 41. The combined configuration of the inserted components 30 is adapted to fit within the opening 28.

Figure 2:
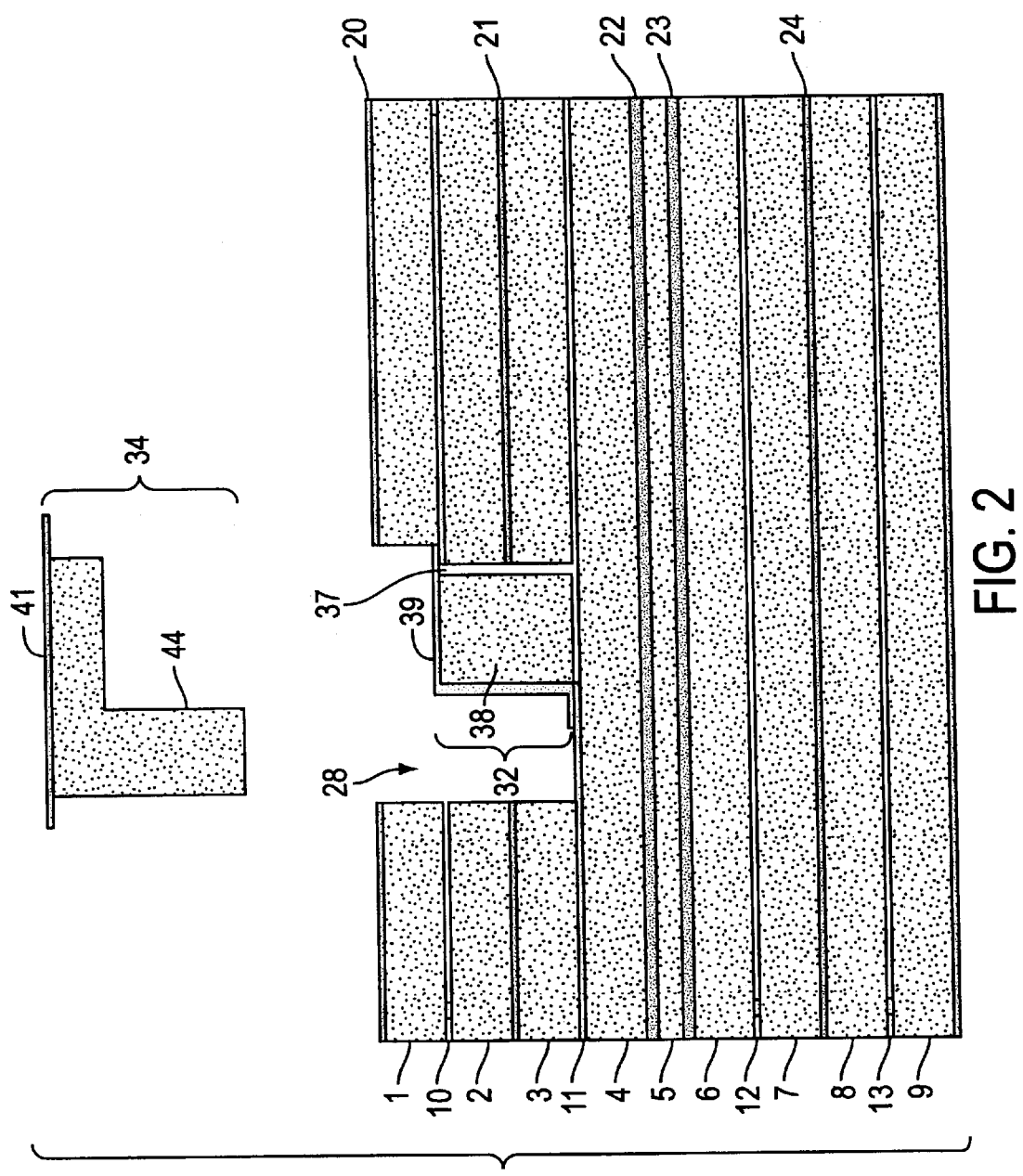
FIG. 2 is a cross-sectional view of a substrate in a further stage of construction in accordance with an embodiment of the invention.
Figure 3:
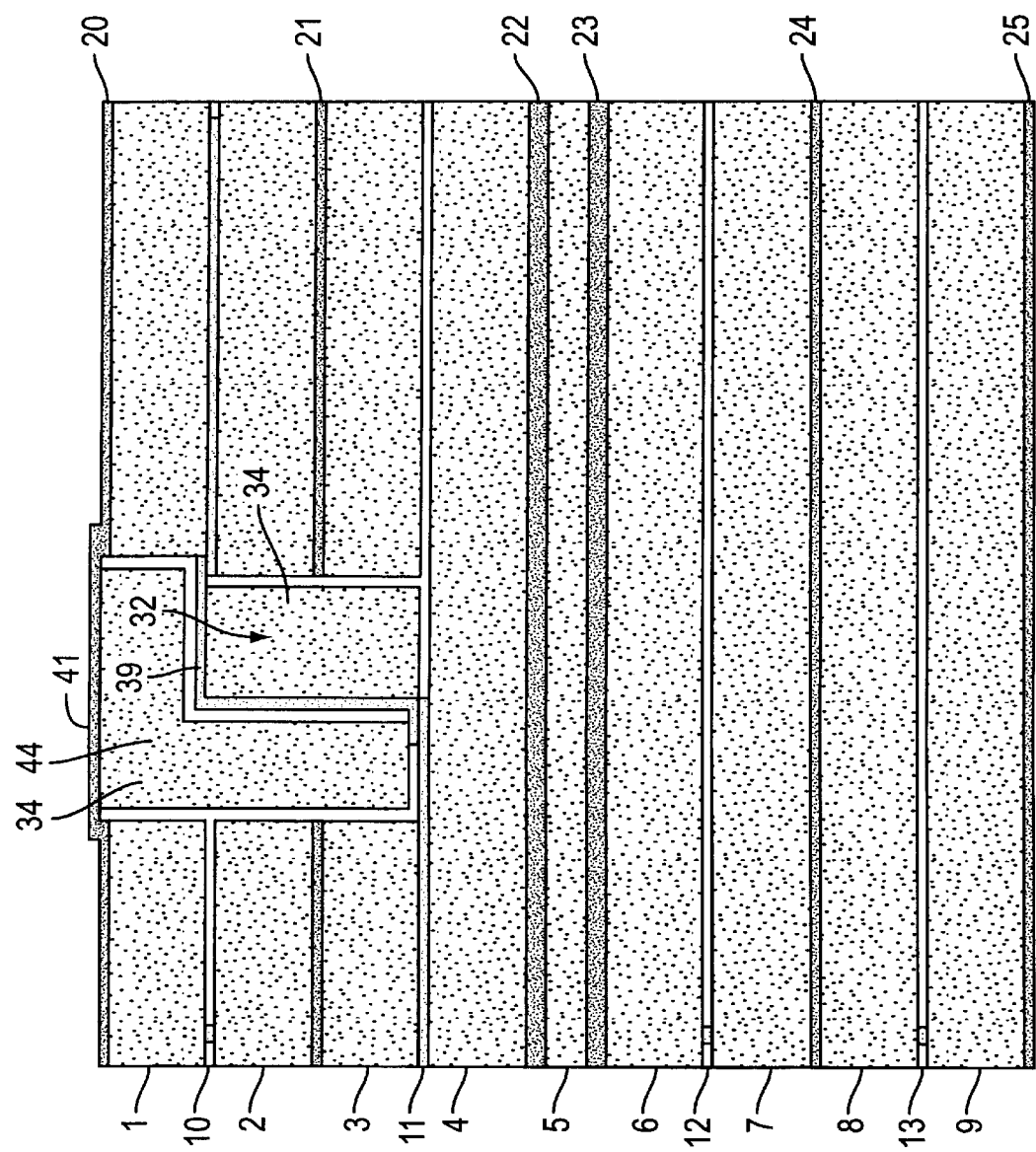
FIG. 3 is a cross-sectional view of a substrate having inserted components in accordance with an embodiment of the invention.

FIG. 2 illustrates the positioning of the first inserted component 32 within the opening 28. The first inserted component 32 is placed such that an edge of the component 32 is adjacent to signal layer 11 within the substrate 100 and a perpendicular channel 37 extends between the signal layers 10 and 11. The channel 37 is preferably filled with a dielectric. optionally, the inserted component could be shaped such that the conductive layer 39 and/or the channel 37 between the signal layers 10 and 11 are at an angle other than 90 degrees, such as 30, 45, 60, etc. The second inserted component 34 may be positioned as shown in FIG. 3, to fill the remainder of the opening 28 (shown in FIG. 1).

Figure 6:
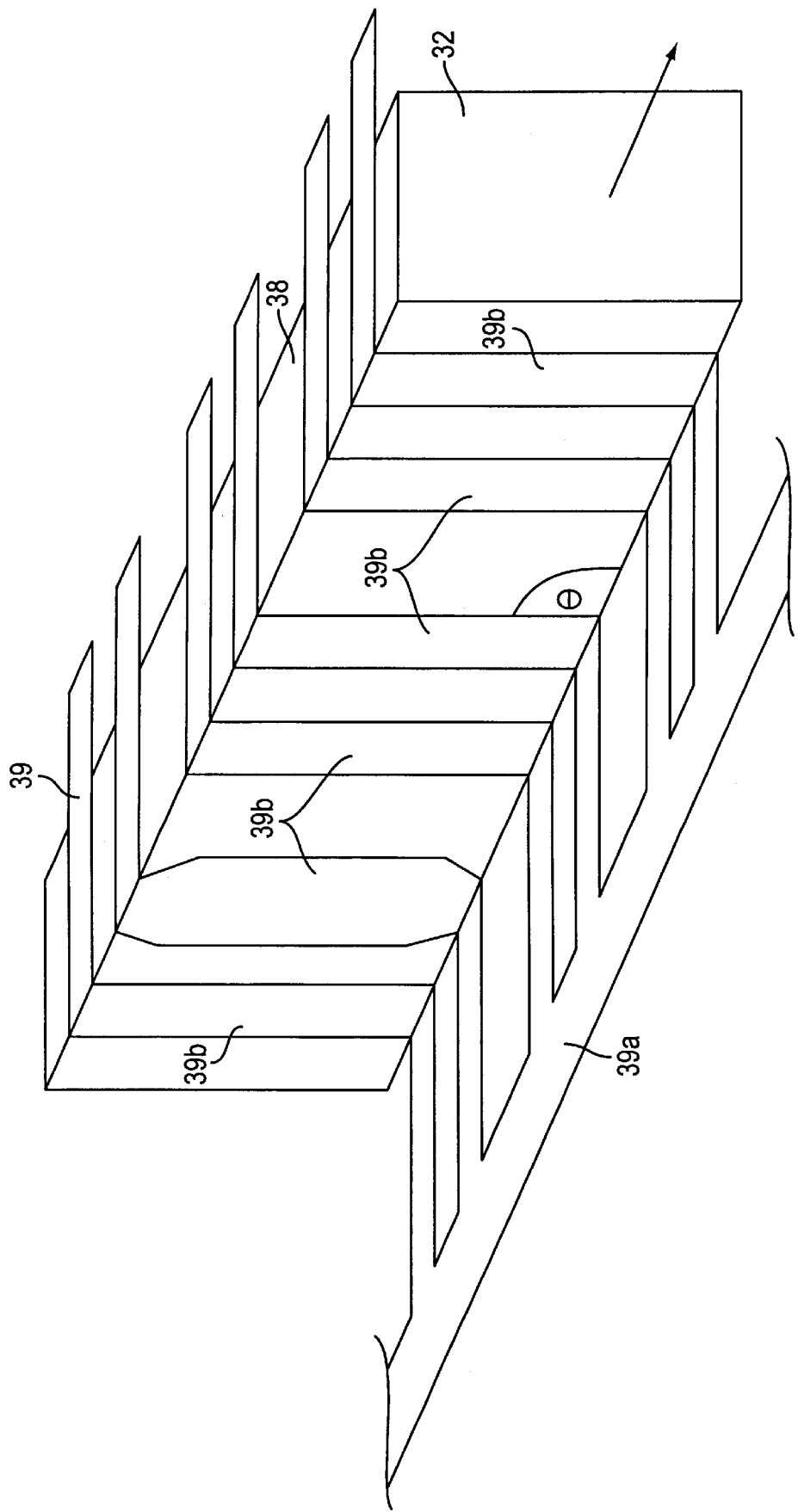
FIG. 6 is perspective view of a first inserted component in accordance with an embodiment of the invention.

FIGS. 6–9 show the inserted components 32 and 34 in greater detail. FIG. 6 illustrates a configuration for the inserted component 32, which preferably includes a dielectric block 38 and a copper lead frame 39. A tie bar 39a is removed upon insertion. Signal tracks 39b are shown as differential pairs. In the example illustrated, in order to obtain 100 ohm differential impedance using a dielectric having a constant of 3.5, the dimensions can be selected as shown. Specifically, the typical signal track has a width equal to 6 mil, the typical space between the signal tracks is equal to 2 mil, and the depth is equal to 0.65 mil. After cutting the tie bar 39a, a signal track overhang will be equal to approximately 7 mil.

The angle theta shown in FIG. 6 can be 90° or alternatively any angle between 45° and 135°. These alternative angles would allow interconnection between layers in directions other than the vertical 90° direction, and would allow freedom to traverse horizontally.

Figure 7:
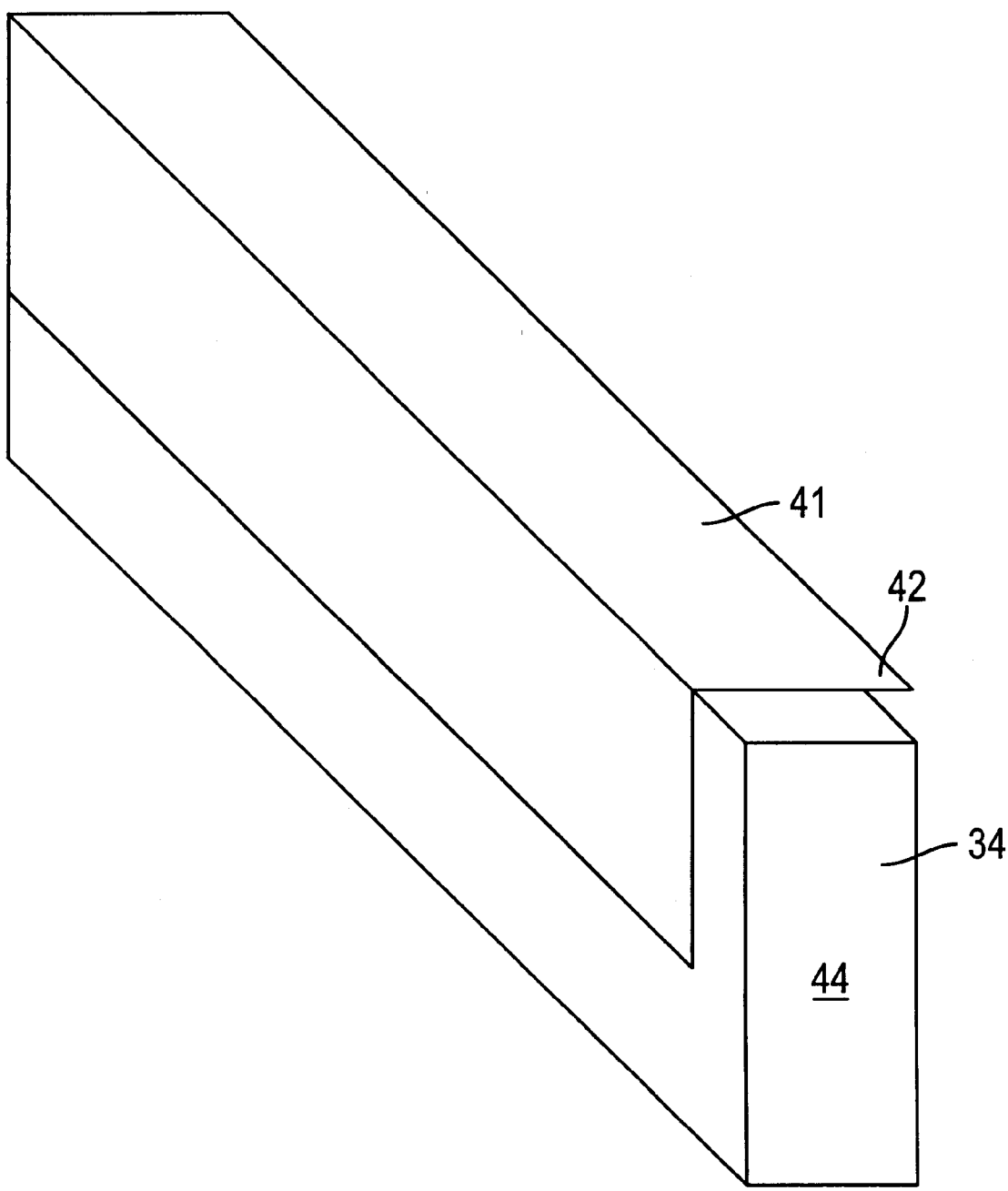
FIG. 7 is a perspective view of a second inserted component in accordance with an embodiment of the invention.

FIG. 7 illustrates the configuration of the inserted component 34 in greater detail. The inserted component 34 preferably comprises a dielectric block 44 and a copper ground plane 41 having an overhang 42. The shape of the dielectric block 44 is determined by the shape of the opening 28 and the shapes of other inserted components.

Figure 8:
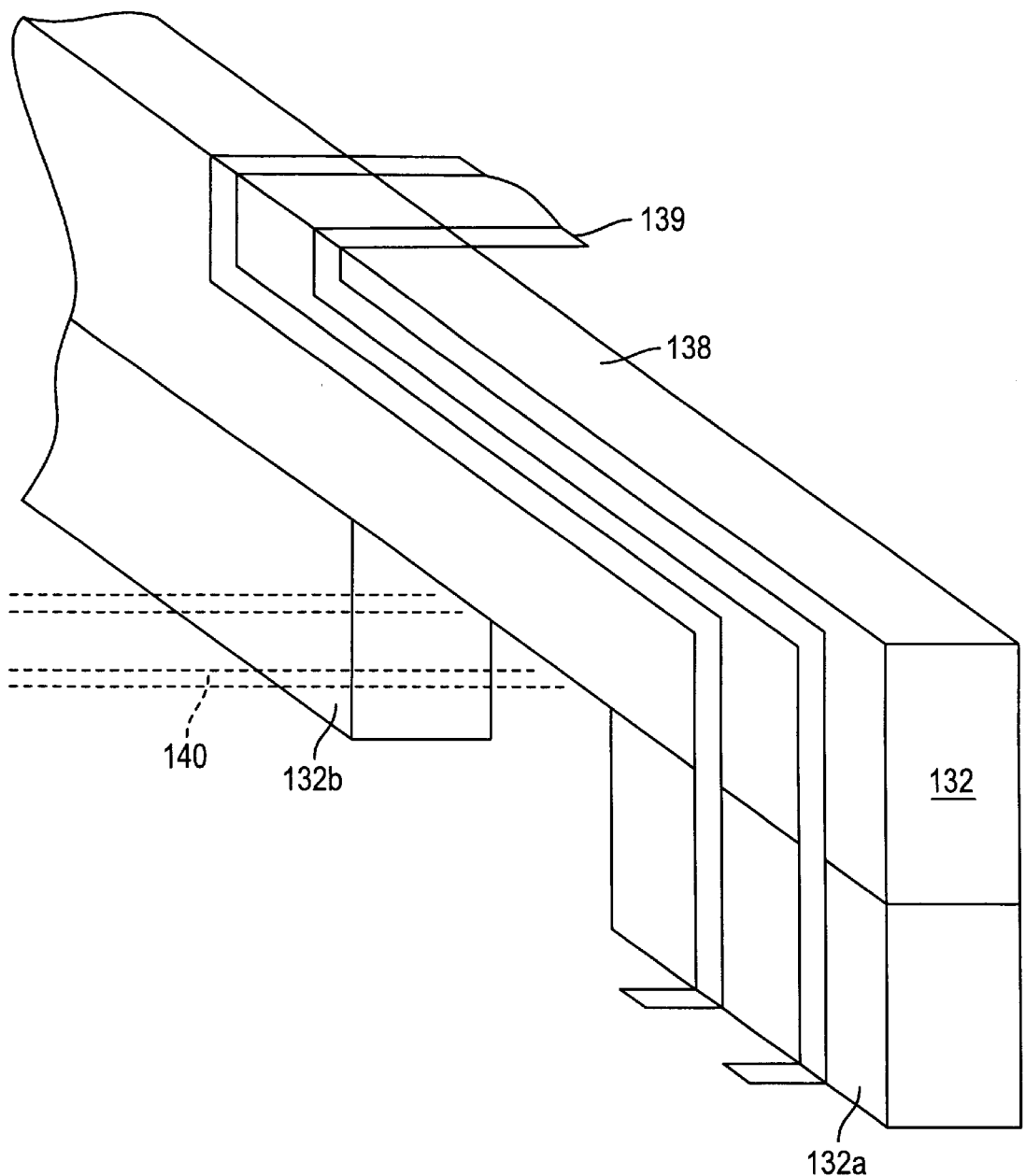
FIG. 8 shows an inserted component in accordance with an additional embodiment of the invention.
Figure 9:
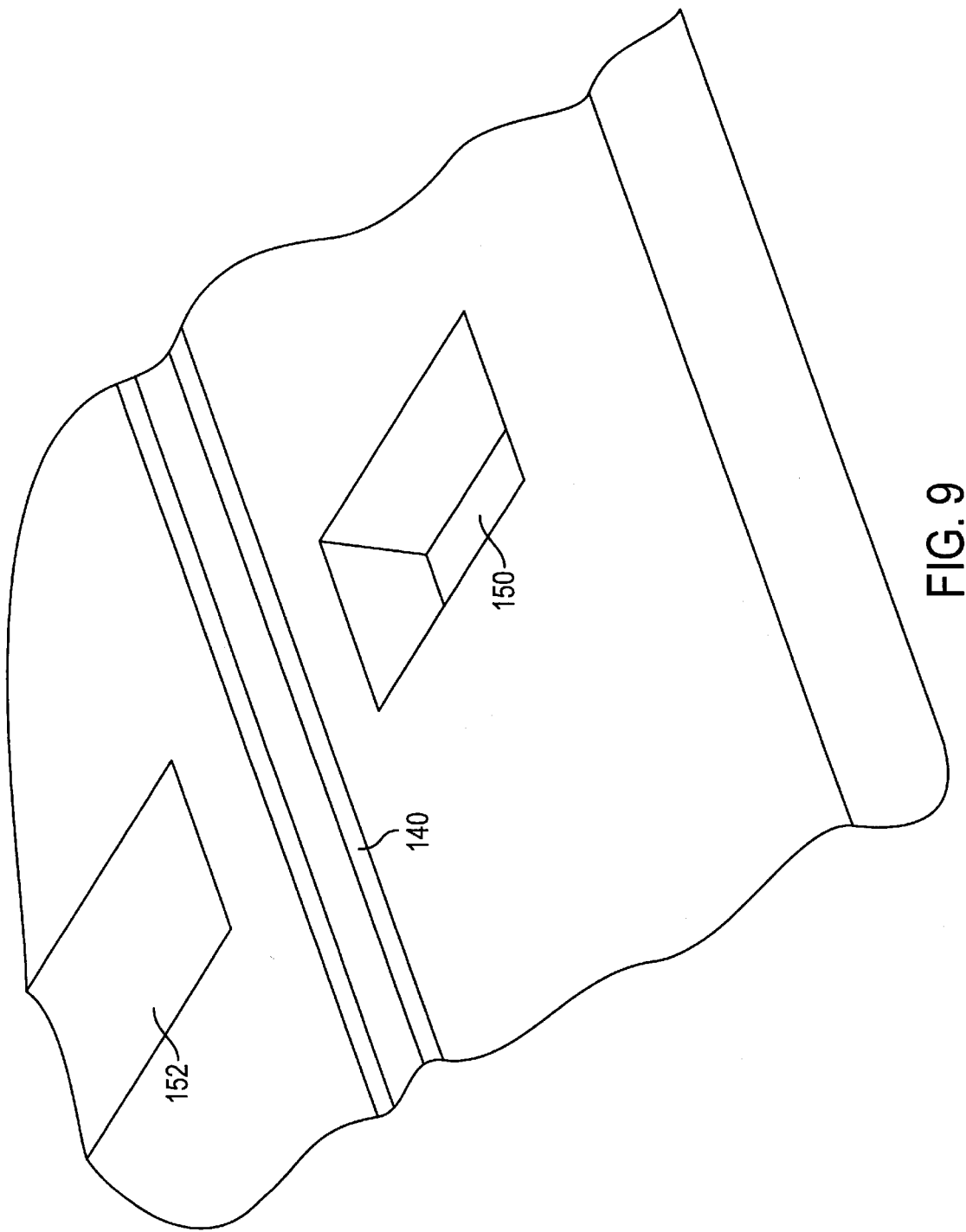
FIG. 9 is a top view showing opening in a substrate in accordance with an embodiment of the invention.

FIG. 8 shows a variation of the configuration of the inserted component 32. The alternative configuration 132 includes a dielectric block 138 having a first leg 132a, second leg 132b, and signal tracks 139. Strip lines 140 are located in the main substrate and will be positioned directly below the inserted component 132. FIG. 9 illustrates the substrate that accommodates the alternative inserted component 132. The opening 150 accommodates the first leg 132a and the opening 152 accommodates the second leg 132b.

Figure 4:
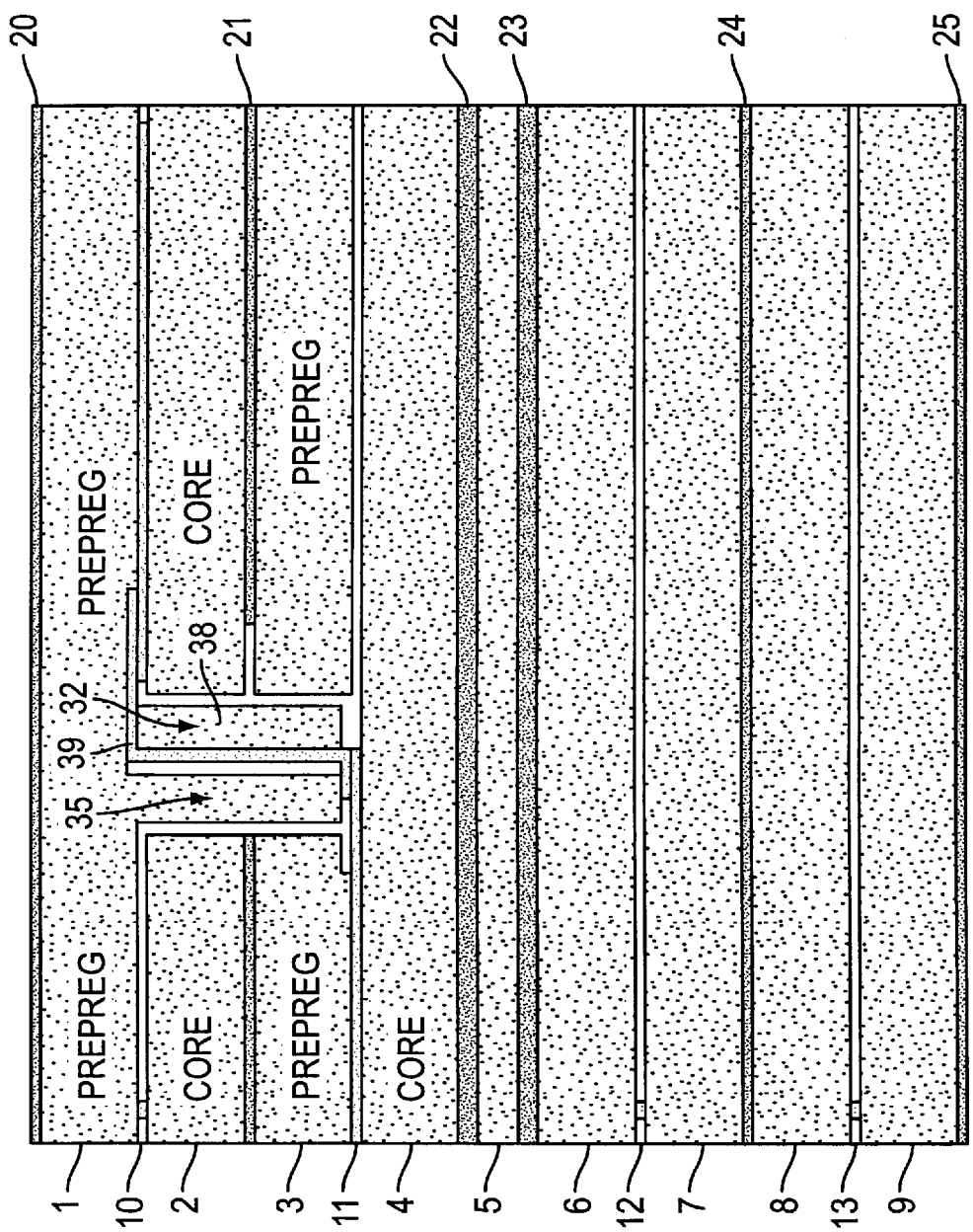
FIG. 4 is a cross-sectional view of a substrate having an inserted component in accordance with an embodiment of the invention.
Figure 5:
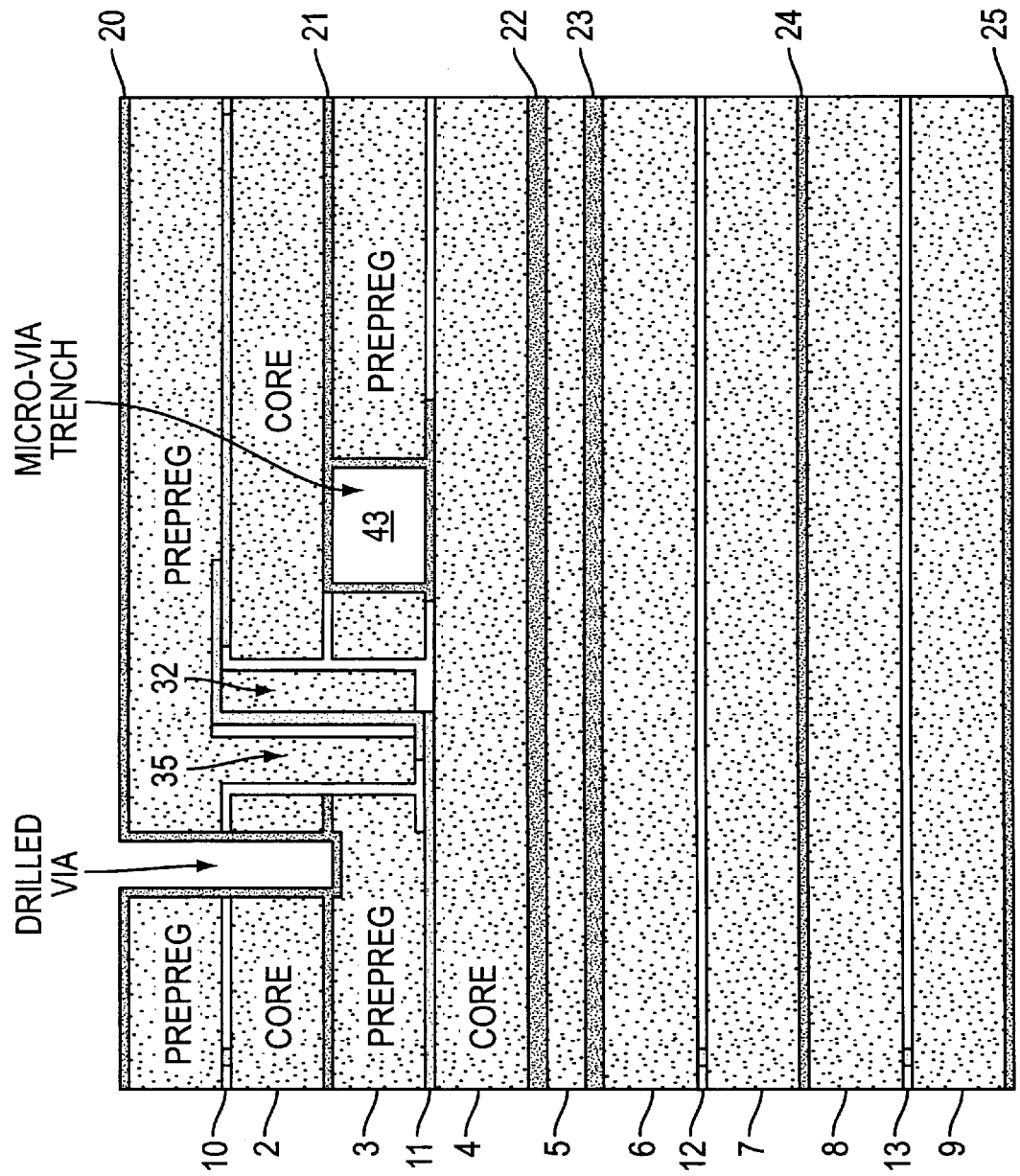
FIG. 5 is a cross-sectional view of a substrate using vias and an inserted component in accordance with an embodiment of the invention.

FIGS. 4 and 5 illustrate an alternative embodiment in which one inserted component 32 is placed within the substrate 100. As in the embodiment of FIG. 1, the inserted component 32 may include a dielectric block 38 and a conductive layer 39. Around the inserted component 32, a dielectric material 35, such as prepreg, completes the substrate.

FIG. 5 shows an alternative embodiment in which vias are used in combination with the inserted component 32 and prepreg layer 35. A micro via trench 43 extends between the signal layer 11 and the ground layer 21. A drilled via 46 extends between the primary layer 20, the signal layer 10, and the ground layer 21.

Figure 10:
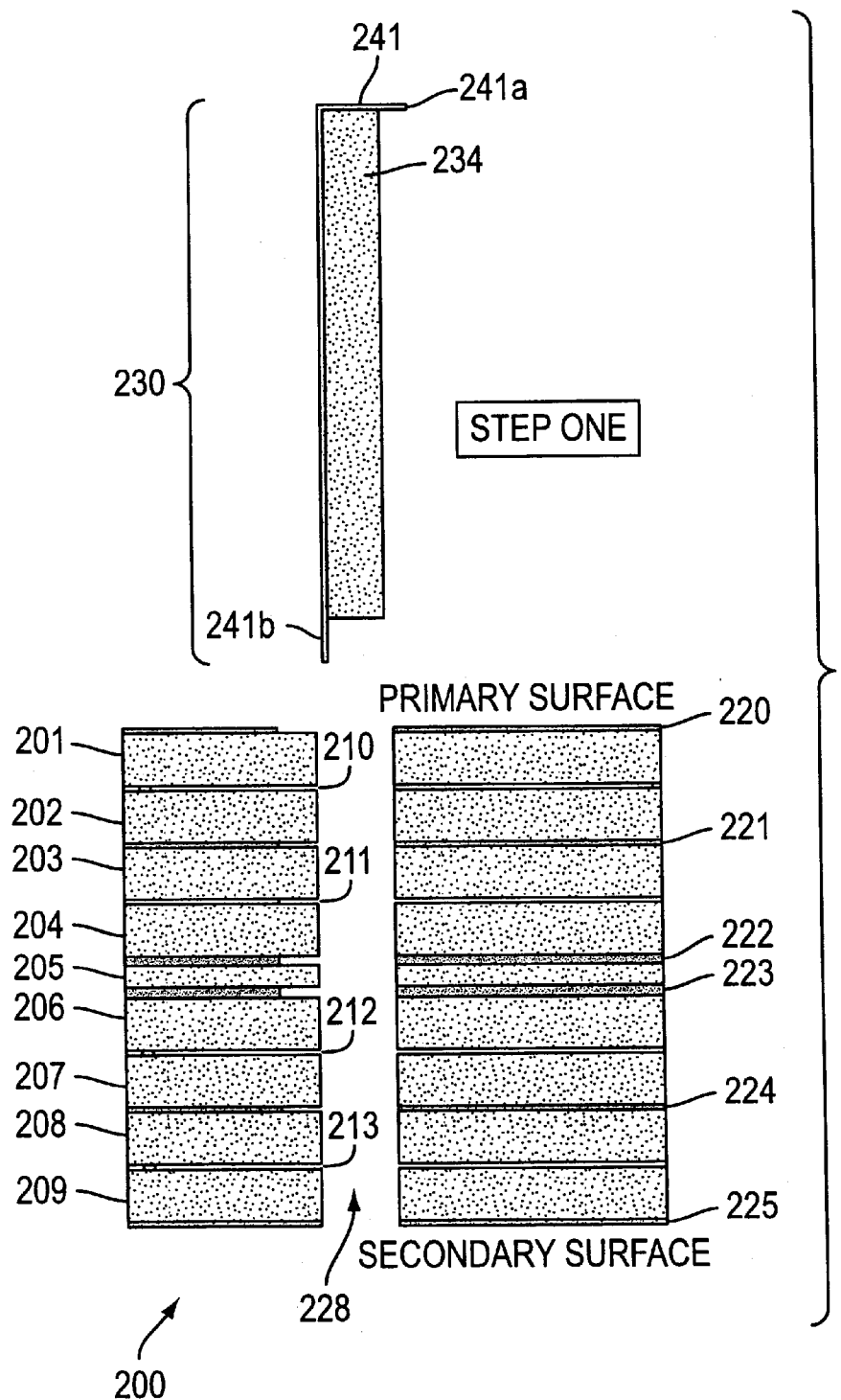
FIG. 10 is a cross-sectional view of the construction of a substrate of an embodiment of the invention.
Figure 11:
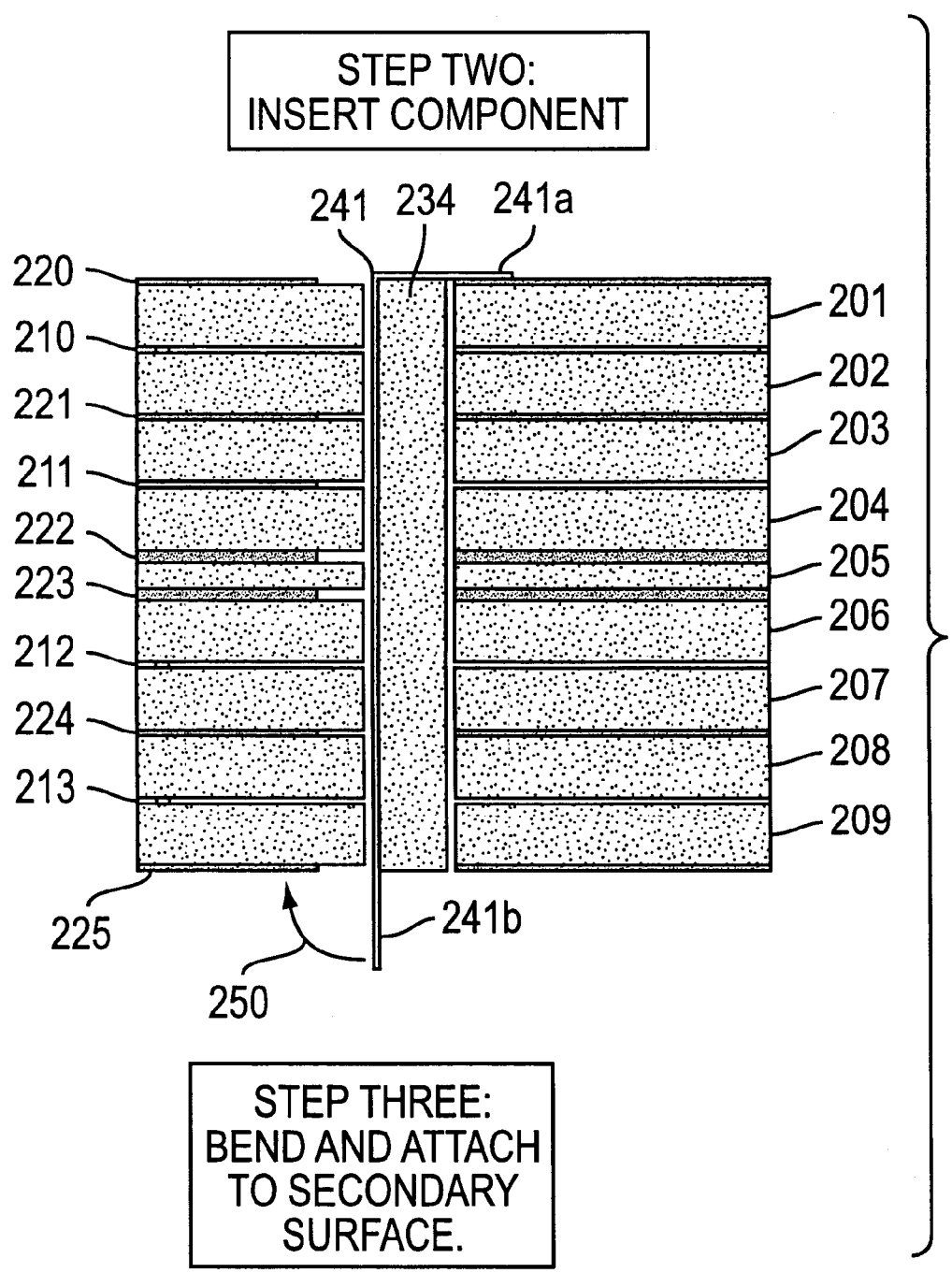
FIG. 11 is a cross-sectional view of the substrate in accordance with an embodiment of the invention.

FIGS. 10 and 11 illustrate steps involved in creating an additional embodiment of a multi-layer substrate of the invention. A substrate 200 includes a plurality of layers. Layers 201–209 are dielectric layers that may be composed of any known dielectric materials. Interspersed between the dielectric layers 201–209 are signal layers 210, 211, 212, and 213, and metal reference planes including ground layers 221, 222, and 224, primary layer 220, and secondary layer 225. The primary layer 220 is preferably formed on the dielectric layer 201 and the secondary layer 225 is preferably formed on the dielectric layer 209. An opening 228 is formed through all layers of the substrate. The opening 228 is preferably created through the use of laser drilling or machining but can be created through any appropriate method.

An inserted component 230 shown in FIG. 10 comprises a dielectric block 234 and a conductive layer 241. The conductive layer 241 comprises a first end 241a and a second end 241b. The inserted component 230 is adapted to fit within the opening 228.

FIG. 11 illustrates the positioning of the component 230 within the opening 228. The inserted component 230 is placed such that an edge of the component 230 is adjacent to the primary layer 220 within the substrate 200 and another edge of the component 230 is adjacent the secondary layer 225 of the substrate 200. The conductive layer 241 is positioned on the dielectric block 234 so as to join the primary layer 220 and secondary layer 225, thereby connecting the intervening metal reference planes 210–213.

As shown by the arrow 250, the second edge 241b of the conductive layer 241 may be turned to lie in the plane of the substrate similarly to the first edge 241a of the conductive layer 241. In the embodiment of FIG. 11, the second edge 241b is turned to lie on an opposite side of the opening from the first edge 241a.

Figure 12:
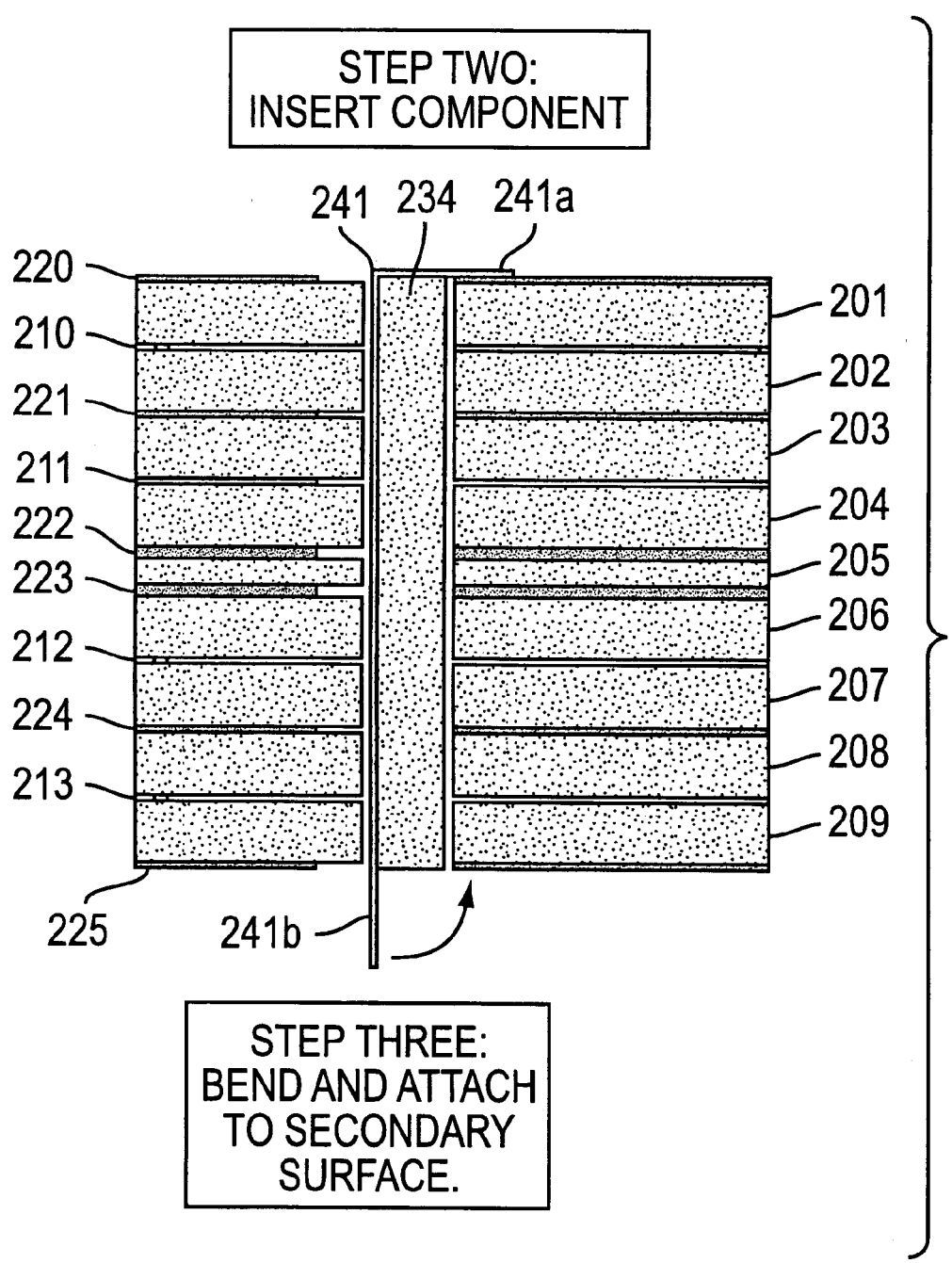
FIG. 12 is a cross-sectional view of the substrate in accordance with an alternative embodiment of the invention.

FIG. 12 shows an alternative embodiment to that shown in FIG. 11. In FIG. 12, the second edge 241b is turned to lie on the same side of the opening 228 as the first edge 241a.

The attachment of all of the aforementioned inserted components can be accomplished through a variety of alternative methods. A first method involves using infrared heat in combination with solder bumps. A second method involves ultrasonic bonding, a third method involves thermal sonic bonding, and an additional method involves vapor phase re-flow. The appropriate method may depend on the choice of dielectric and conducting materials.

In all embodiments of the invention, the physical dimensions of the signal layers that join the metal reference planes are controlled to allow impedance matching with rectangular anti-pads. The dielectric blocks of all embodiments are of a continuous construction and can be made by a milling or molding process. Typically, the dielectric blocks will be several inches long. The lead frame is typically copper foil and is also cut to be several inches long to match the length of the dielectric block. Prior to cutting, the lead frame could contain hundreds of signal tracks. In a typical multi-layer substrate of the invention, only one to about five tracks may be required. The lead frame may be bonded to the dielectric block in any number of known ways. The bonding can be accomplished simply with glue if desired. Prior to placing the configuration into the substrate, the lead frame may be trimmed to size. In order to make connection, micro solder bumps and infrared heat may be employed. Instead of using the technique identified above, a conductor such as copper could be photo-etched and attached to the dielectric block. Alternatively, the substrate itself could be clad with a conductor.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A method for connecting signal tracks on different layers in a multi-layer substrate, the method comprising the steps of:

forming an opening in the substrate through at least two adjacent electrically conducting layers of the substrate;

inserting a first component into the opening, the first component comprising a conductive layer, the first component extending through the substrate such that the conductive layer electrically connects at least two signal tracks on different signal layers of the substrate; and bonding the first component to the substrate.

2. The method of claim 1, further comprising bonding the conductive layer to a dielectric block.

3. The method of claim 1, further comprising filling an opening around the first component with additional material, such that the conductive layer is disposed between the first component and the additional material.

4. The method of claim 3, wherein filling the opening comprises inserting a second component.

5. The method of claim 3, wherein filling the opening comprises allowing a material to flow into the opening.

6. The method of claim 1, further comprising bonding the first component to the substrate using one of infrared bonding, ultrasonic bonding, thermal sonic bonding, and vapor phase re-flow.

7. The method of claim 1, wherein the first component is made from a material and is formed in a configuration calculated to provide impedance matching.

8. The method of claim 1, wherein forming an opening comprises using laser drilling.

9. The method of claim 1, further comprising adding additional substrate layers to surround the opening.

10. The method of claim 9, further comprising forming the opening through all layers of the substrate.

11. The method of claim 10, further comprising inserting the first component through the an insertion end of the opening, such that an end of the conductive layer furthest from the insertion end of the opening extends out of an opposite end of the opening.

12. The method of claim 11, further comprising bending the conductive layer extending out of the opposite end of the opening so that the conductive layer is parallel to the substrate.

13. A substrate comprising:

a plurality of signal tracks on different layers;

an opening formed in at least two electrically conducting layers of the substrate; and a first component inserted in the opening, the first component comprising a conductive layer, wherein placement of the first component creates an electrical connection between at least two signal tracks on different layers of the substrate.

14. The substrate of claim 13, further comprising additional material filling an opening around the first component.

15. The substrate of claim 14, wherein the additional material comprises a second component.

16. The substrate of claim 14, wherein the additional material comprises a flowable material that flows into the opening.

17. The substrate of claim 13, further comprising one of an infrared bond, an ultrasonic bond, a thermal sonic bond, and vapor phase re-flow for attaching the first component to the substrate.

18. The substrate of claim 13, wherein the first component comprises a dielectric block made from a material and in a configuration calculated to provide impedance matching.

19. The substrate of claim 13, wherein the first component creates an electrical connection between all of the signal layers of the multi-layer substrate.

20. A system for connecting signal tracks on different layers within a multi-layer substrate, the system comprising:

a first passive component insertable into a substrate, the first passive component shaped to contact at least two signal tracks on different layers of the multi-layer substrate;

additional material shaped to be positioned adjacent the first inserted component so as to create an electrical conductor path between the additional material and the first inserted component and intersecting with the at least two signal layers.

21. The system of claim 20, wherein the additional material comprises a second inserted component.

22. The system of claim 20, wherein the additional material comprises a fluid material that flows into the opening.

23. The system of claim 20, further comprising one of an infrared bond, an ultrasonic bond, a thermal sonic bond, and vapor phase re-flow for attaching the first component to the substrate.

24. The system of claim 20, wherein the first component comprises a dielectric block bonded to a lead frame.

25. The system of claim 24, wherein the dielectric block is made from a material and in a configuration calculated to provide impedance matching.

26. The system of claim 20, wherein the first passive component is shaped to contact signal tracks on all of the layers of the multi-layer substrate.

* * * * *